(12) United States Patent
Kaczynski

(10) Patent No.: US 7,982,518 B1
(45) Date of Patent: Jul. 19, 2011

(54) CONTROLLING TIMING IN ASYNCHRONOUS DIGITAL CIRCUITS

(75) Inventor: Brian J. Kaczynski, Santa Clara, CA (US)

(73) Assignee: Atheros Communications, Inc., San Jose, CA (US)

( * ) Notice: Subject to any disclaimer, the term of this patent is extended or adjusted under 35 U.S.C. 154(b) by 835 days.

(21) Appl. No.: 12/026,535

(22) Filed: Feb. 5, 2008

(51) Int. Cl.
*G06F 1/04* (2006.01)

(52) U.S. Cl. ........................ 327/291; 327/392

(58) Field of Classification Search .................. 327/291, 327/299
See application file for complete search history.

(56) References Cited

U.S. PATENT DOCUMENTS

| | | | |
|---|---|---|---|
| 5,430,681 A * | 7/1995 | Sugawara et al. ............. 365/222 |
| 5,581,507 A * | 12/1996 | Scherpenberg et al. . 365/189.09 |
| 5,808,492 A * | 9/1998 | Chow ............................ 327/108 |
| 7,579,892 B2 * | 8/2009 | Kadanka ....................... 327/291 |
| 7,656,240 B2 * | 2/2010 | Wong et al. ..................... 331/57 |
| 2007/0273423 A1 * | 11/2007 | Kadanka ....................... 327/291 |

* cited by examiner

*Primary Examiner* — Lincoln Donovan
*Assistant Examiner* — Ryan Jager
(74) *Attorney, Agent, or Firm* — Bever, Hoffman & Harms, LLP; Jeannette S. Harms

(57) ABSTRACT

A timing circuit for generating asynchronous signals is provided that uses minimal area while maximizing speed. This timing circuit can include a timing control block and disable/enable circuitry. The timing control block can include an SR latch and first and second delay blocks. The SR latch can generate first and second signals, wherein the first and second signals are asynchronous. The first delay block can generate a delayed first signal and provide that signal to a first input terminal of the SR latch. Similarly, the second delay block can generate a delayed second signal and provide that signal to a second input terminal of the SR latch. Notably, the first and second delay blocks delay positive going edges of the first and second signals differently than negative going edges of the first and second signals.

10 Claims, 2 Drawing Sheets

CONTROLLING TIMING IN ASYNCHRONOUS DIGITAL CIRCUITS

BACKGROUND OF THE INVENTION

1. Field of the Invention

The present invention relates to a timing circuit and in particular to a timing circuit for controlling the timing in an asynchronous digital circuit.

2. Related Art

Many systems may require asynchronous signals for optimal operation. For example, a successive approximation register digital to analog converter (SAR DAC) can include one signal that triggers a start operation of the SAR DAC and another signal that triggers operation of a comparator within the SAR DAC. Prior art circuits for generating such asynchronous signals have required excessive area for implementation and/or have provided sub-optimal performance. Therefore, a need arises for a timing circuit that can generate asynchronous signals using minimal area while maximizing speed.

SUMMARY OF THE INVENTION

A timing circuit for generating asynchronous signals is provided that uses minimal area while maximizing speed. This timing circuit can include a timing control block and disable/enable circuitry. The timing control block can include an SR latch and first and second delay blocks. The SR latch can generate first and second signals, wherein the first and second signals are asynchronous.

The first delay block can generate a delayed first signal and provide that signal to a first input terminal of the SR latch. Similarly, the second delay block can generate a delayed second signal and provide that signal to a second input terminal of the SR latch. Notably, the first and second delay blocks delay positive going edges of the first and second signals differently than negative going edges of the first and second signals.

The enable/disable circuitry can include a state machine that generates a disable signal. This disable signal and a clock signal can be provided to input terminals of the enable/disable circuitry. An output of the enable/disable circuitry can be provided to a set of input terminals of the timing control block.

In one embodiment, the second delay block can receive the second signal. An output of the second delay block or an external control signal, whichever event occurs first, can trigger the SR latch to change state. In one embodiment, the first signal triggers an SAR DAC (successive approximation register digital to analog converter), the second signal triggers a comparator, and the external control signal indicates a comparator settled condition. The first and second delay blocks can include CMOS inverters.

A method for generating asynchronous signals is also provided. In this method, first and second signals are generated using an SR latch, wherein the first and second signals are asynchronous. A delayed first signal can be generated and then provided to a first input terminal of the SR latch. Similarly, a delayed second signal can be generated and then provided to a second input terminal of the SR latch. Notably, the first and second delay blocks can delay positive going edges of the first and second signals differently than negative going edges of the first and second signals to avoid a premature change of state of the SR latch.

The method can further include generating a disable signal for the SR latch. In one embodiment, the method can further include providing an external control signal that in combination with delayed second signal can change the state of the SR latch depending on which signal is generated first. In one embodiment, the first signal triggers an SAR DAC (successive approximation register digital to analog converter), the second signal triggers a comparator, and the external control signal indicates a comparator settled condition.

DETAILED DESCRIPTION OF THE FIGURES

Figure 1:
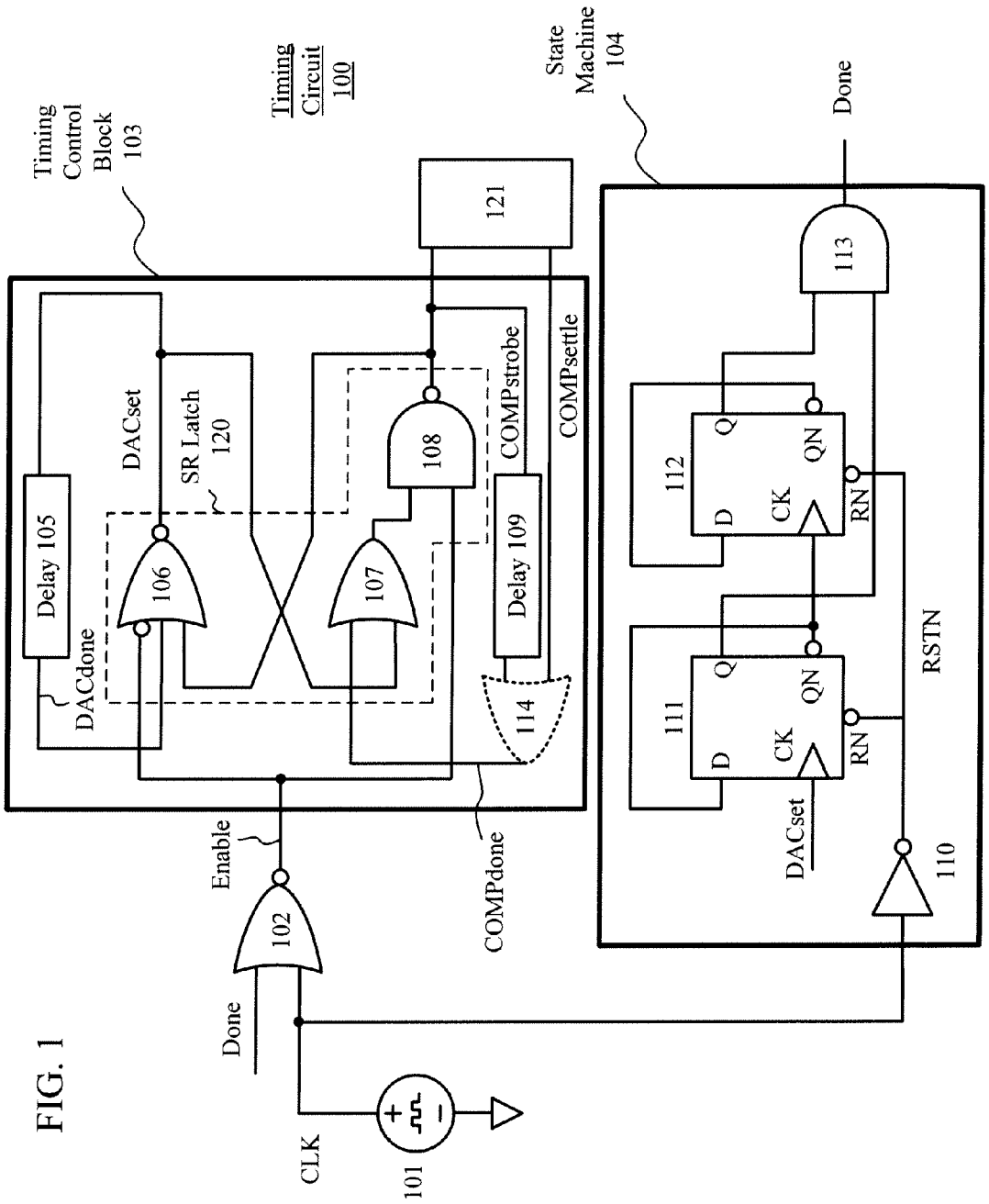
FIG. 1 illustrates an exemplary timing circuit for controlling the timing in asynchronous digital circuits.

FIG. 1 illustrates an exemplary timing circuit 100 for controlling the timing in an asynchronous digital circuit. Note that although the signals described herein relate to an SAR DAC, other embodiments of timing circuit 100 can generate asynchronous signals for other types of asynchronous digital circuits.

In this embodiment of timing circuit 100, a CLK signal functions as an active-low enable. This signal is called CLK because it is assumed that the asynchronous logic will be enabled periodically at a rate governed by some low-frequency clock 101. Typically, the clock half-period is slower than the time required by the asynchronous logic. In the case of an SAR ADC, this low frequency can be the ADC conversion rate.

Timing circuit 100 can be conceptually characterized as including a timing control block 103 and enable/disable circuitry, which includes a NOR gate 102 and a state machine 104. Note that although NOR gate 102, timing control block 103, and state machine 104 are shown as separate components, other embodiments of timing circuit 100 can include fewer or more components to achieve the functionality described below. The CLK signal is provided to one input terminal of a NOR gate 102, which in turn outputs an Enable signal to timing control block 103. The CLK signal is also provided to state machine 104, which outputs a Done (i.e. a disable) signal that is provided to another input terminal of NOR gate 102. Exemplary embodiments of timing control block 103 and state machine 104 will now be described in detail.

In one embodiment, timing control block 103 can include a delay block 105, a NOR gate 106, an OR gate 107, a NAND gate 108, a delay block 109, and an optional OR gate 114. The Enable signal is provided to an inverted input terminal of NOR gate 106 and an input terminal of NAND gate 108. The output terminal of NOR gate 106 is provided to delay block 105 as well as an input terminal of OR gate 107. The output terminal of NAND gate 108 is provided to delay block 109 as well as an input terminal of NOR gate 106. The outputs of delay blocks 105 and 109 are provided, respectively, to input terminals of NOR gate 106 and OR gate 114. OR gate 114, which also receives an external signal (described below), can provide its output to an input terminal of OR gate 107. In this configuration, NOR gate 106, OR gate 107, and NAND gate 108 can form an SR latch 120. In one embodiment, delay blocks 105 and 109 can be implemented with CMOS inverters. Note that OR gate 114 in other embodiments of timing control block 103, and in particular for other applications of timing circuit 100, can be removed such that delay block 109 provides its output directly to an input terminal of OR gate 107.

In one embodiment, state machine 104 can include an inverter 110, two D flip-flops 111 and 112, and an AND gate 113. Inverter 110 receives the CLK signal and provides the inverted CLK signal to the inverted reset terminals of flip-flops 111 and 112. A DACset signal (described in further detail below) is provided to the clock (CK) terminal of flip-flop 111. The Q output terminals of flip-flops 111 and 112 can be connected to the input terminals of AND gate 113. The inverted Q (QN) terminals of flip-flops 111 and 112 can be connected, respectively, to the D input terminals of flip-flops 111 and 112. The QN terminal of flip-flop 111 can be connected to the CK terminal of flip-flop 112. AND gate 113 can output the Done signal to NOR gate 102.

Figure 2:
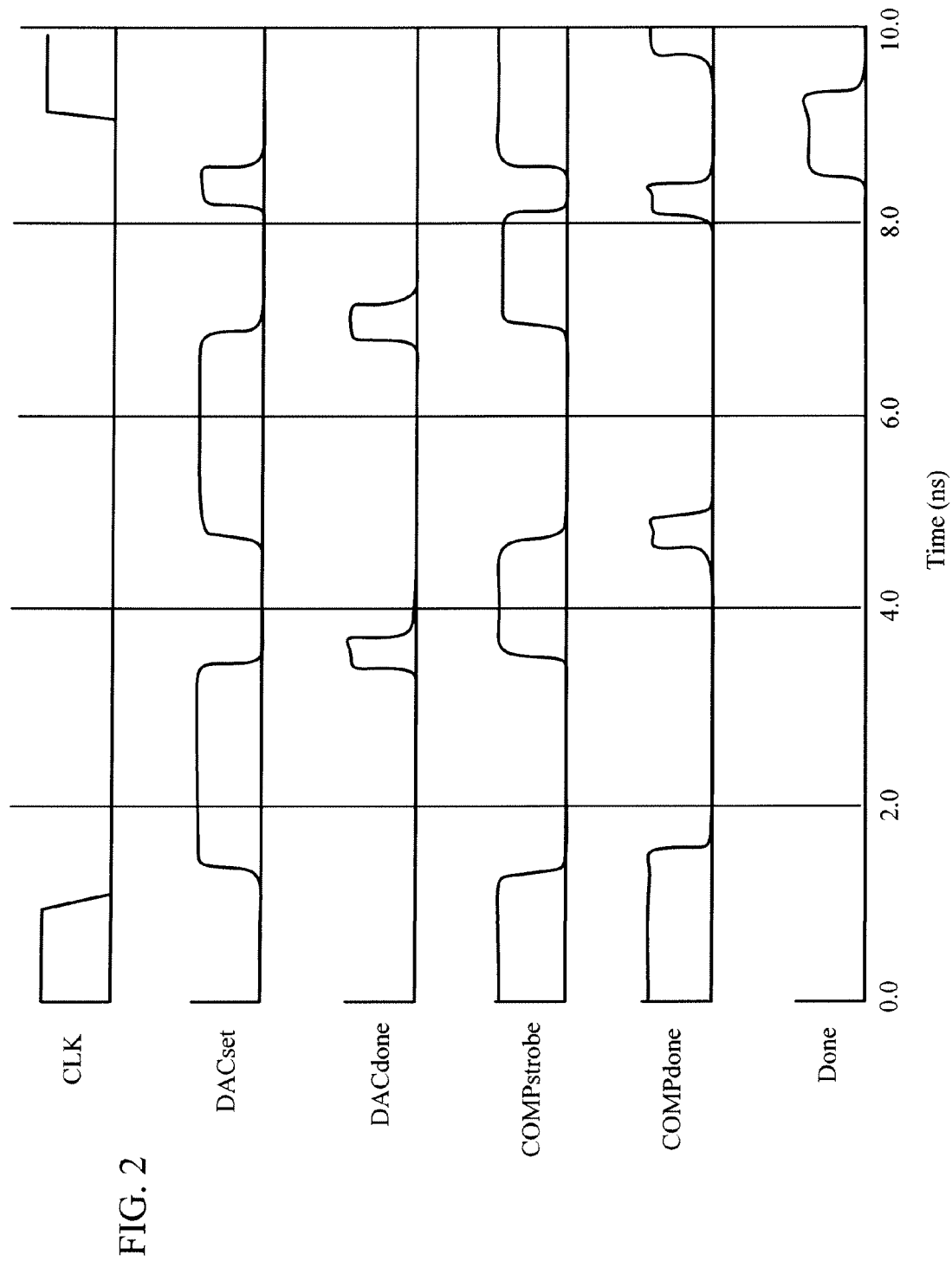
FIG. 2 illustrates signal generation in the timing circuit of FIG. 1.

Referring also to FIG. 2, which illustrates signal generation in the timing circuit of FIG. 1, a logic one ("1") CLK signal can drive timing circuit 100 to a dormant state. This logic one CLK signal ensures that NOR gate 102 outputs a logic zero ("0") Enable signal, which in turn will force the state of SR latch 120 to be (DACset,COMPstrobe)=(0,1). That is, the logic zero Enable signal is inverted when it is provided to NOR gate 106, thereby forcing this gate to output a logic zero. In contrast, the logic zero Enable signal is provided to NAND gate 108, thereby forcing this gate to output a logic one. Assuming that delay blocks 105 and 109 have reached their steady-state (described below), their two outputs DACdone and COMPdone, respectively, will also be 0 and 1, respectively.

When the asynchronous circuitry is enabled, i.e. when the CLK signal has transitioned to a logic zero, the DACset signal can advantageously become an asynchronous clock. Note that in this embodiment of state machine 104, the DACset signal clocks a simple 2-bit counter that is formed by inverter 110, flip-flops 111 and 112, and AND gate 113. In the configuration of state machine 104 described above, when a count of three is achieved, the asynchronous circuitry is disabled (i.e. the Done signal transitions to a logic one) until the next enable cycle of CLK (i.e. when the CLK signal has transitioned to a logic zero). Note that in other embodiments, state machine 104 can include different and/or more complex components to provide similar functionality. For example, in another embodiment, the DACset signal can clock a general state machine, which can disable SR latch 120 after a predetermined period of time, thereby putting the asynchronous circuits in the dormant state until the next cycle of the CLK signal. Therefore, this embodiment of state machine 104 is exemplary only and is not limiting.

When CLK is deasserted, SR latch 120 immediately toggles into the state (DACset,COMPstrobe)=(1,0). A logic zero COMPstrobe signal forces the output of delay block 109 to be logic zero as well. Assuming that an external signal COMPsettle (described below in further detail) is also zero, the output of OR gate 114 would also be a logic zero. After the delay period of delay block 105, the logic one propagates to the DACdone input, thereby forcing the state of SR latch 120 to toggle to (DACset,COMPstrobe)=(0,1). A logic zero DACset signal forces the output of delay block 105 to be a logic zero as well. After the delay period of delay block 109, the logic one propagates to the COMPdone input, thereby forcing SR latch 120 to toggle again to the state (DACset,COMPstrobe)=(1,0). This process can repeat at a period equal to the sum of the two delays until the asynchronous circuitry is disabled.

Referring back to timing control block 103, delay blocks 105 and 109 can advantageously generate asymmetric delays. That is, delay blocks 105 and 109 can delay the positive going edges of their input signals differently than the negative going edges of those input signals. Specifically, in this implementation of SR latch 120, each delay block only delays positive going signal edges and allows negative going edges to propagate with minimal delay. Note that the "hold" state of SR latch 120 is achieved when both inputs, i.e. DACdone and COMPdone, are logic zero. Thus, DACdone and COMPdone are preferably narrow positive pulses to avoid the case when both of these inputs are logic one (which would result in a premature change of state of SR latch 120). Generating asymmetric delays in delays 105 and 109 maximize the probability that these conditions can be realized.

Generating asymmetric delays is well-known and can be implemented in various ways. Typically, a delay block generating an asymmetric delay can use a first section to output a rising edge and a second section to output a falling edge. Each section can use standard logic gates to achieve the desired properties of delay. In one embodiment, the physical size of the transistors used to implement the logic gates can be designed to vary propagation times.

To understand how the delays of delay blocks 105 and 109 are determined for an ADC, a brief explanation of how a successive approximation register (SAR) ADC works is provided. The SAR ADC samples its input, and then performs a binary search to identify the digital code that most closely matches the input. This identification is generally done with a DAC (digital to analog converter) and a comparator that compares the DAC output with the sampled analog input.

During the convert phase, asynchronous operations can set a predetermined number of bits (e.g. 10 bits) in turn, starting with the MSB (most significant bit) and ending with the LSB (least significant bit). In one embodiment, the DAC can be set to output a middle of a full-scale (FS) range. Timing control block 103 asserts the COMPstrobe signal, thereby enabling the comparator, and outputs the COMPdone signal when the decision is resolved.

Notably, the decision indicates if the input is in the lower half of the input range (i.e. a digital decision of 0) or in the upper half of the input range (i.e. a digital decision of 1). Thus, the decision can yield the MSB. This decision can be stored in a successive-approximation register. Then, the DAC can be commanded to output a voltage that is precisely in the middle of the previously decided range. Thus, if MSB=0, then the new voltage output by the DAC is at ¼ FS. In contrast, if MSB=1, then the new DAC output is at ¾ FS.

At this point, the comparator can make a new decision that determines the next most-significant bit of the result. The algorithm can proceed in a similar manner until all bits have been determined. The bit sequence held in the SAR is then output as the digital representation of the just-converted input.

In the context of an ADC, the delay generated by delay block 105 can advantageously match the settling time of the DAC. In one embodiment that provides accurate conversion, the DAC can settle to within less than 1 LSB before the comparator is strobed.

In one embodiment, the delay generated by delay block 109 can be determined as follows. The COMPdone signal is generated by sensing when the comparator outputs are ready as indicated by the COMPsettle signal from comparator 121 or when the COMPstrobe signal has finished propagating through a delay path in delay block 109 (e.g. the CMOS inverters described above), whichever condition occurs first. Notably, by using OR gate 114, either the expiration of the delay or the comparator settling can trigger SR latch 120 to change state. In other words, the comparator decision time can be effectively capped by a maximum period determined by delay 109. Thus, the COMPsettle signal and OR gate 114 can be used to selectively provide the delayed signal from delay block 109 or an early trigger signal to an input terminal of OR gate 107. In other applications of timing circuit 100, OR gate 114 may be removed and the output of delay block 109 can be provided directly to an input terminal of OR gate 107.

Note that the comparator resolution time is generally a function of the size of the signal at its input. That is, the bigger the signal, the faster the comparator resolves. The asynchronous SAR ADC can take advantage of this dependence of comparator speed on input size.

In comparison, in a synchronous SAR ADC, the time allotted to the comparator resolution is constant irrespective of the input size. Therefore, the allotted time for comparator resolution must be chosen such that the minimum size signal has enough time to resolve. The total time occupied by comparator decisions is the sum of the times for each of the N bits in an N-bit converter. In contrast, in an asynchronous SAR ADC, the total time will always be less than for a synchronous SAR because only one of the N decisions has to deal with the truly worst-case input smaller than 1 LSB.

As indicated above and in the context of this implementation of SR latch 120, the only constraint on the delays is that the negative-edge propagation delays must be shorter than the lesser of the two positive-edge propagation delays. This condition guarantees that the DACdone and COMPdone signal inputs to SR latch 120 will never both be 1.

The timing overhead is the time required for SR latch 120 to change state. Because the state change occurs when either input goes from 0 to 1 (with the other input at 0), it can be seen that this takes two inverter delays. Thus, the timing overhead for an entire asynchronous cycle is four inverter delays (because SR latch 120 changes state twice). Therefore, a more accurate expression for the total asynchronous clock period is the sum of the two long delays plus four inverter delays. Advantageously this minimum timing overhead can be achieved in this type of asynchronous logic timing control circuit.

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent to practitioners skilled in this art.

For example, although the SR latch described above can be implemented with the logic gates shown in FIG. 1, other embodiments of a timing circuit can use different logic gates. Exemplary logic gates for implementing an SR latch can include two NAND gates. Such other implementations of the timing circuit may include different delays. For example, if the SR latch is implemented with NAND gates, then the negative going edges can be delayed more than the positive going edges (i.e. the opposite of that described above). In this embodiment, the inputs to the SR latch can be designed such that they are not zero at the same time, thereby ensuring that the SR latch does not transition prematurely. Accordingly, it is intended that the scope of the invention be defined by the following claims and their equivalents.

The invention claimed is:

1. A timing circuit for generating asynchronous signals, the timing circuit comprising:
   a timing control block including:
   an SR latch that generates a first signal and a second signal, the first and second signals being asynchronous;
   a first delay block for delaying the first signal, generating a delayed first signal, and providing the delayed first signal to a first input terminal of the SR latch;
   a second delay block for delaying the second signal, generating a delayed second signal, and providing the delayed second signal to a second input terminal of the SR latch, wherein the first and second delay blocks delay positive going edges of the first and second signals differently than negative going edges of the first and second signals; and
   enable/disable circuitry including:
   a first logic gate; and
   a state machine that generates a disable signal, the disable signal and a clock signal being provided to input terminals of the first logic gate, an output of the first logic gate being provided to a set of input terminals of the timing control block.

2. The timing circuit of claim 1, wherein the first signal triggers an SAR DAC (successive approximation register digital to analog converter) and the second signal triggers a comparator.

3. The timing circuit of claim 1, further including a second logic gate, wherein the second delay block receives the second signal, and wherein the second logic gate receives the delayed second signal and an external control signal.

4. The timing circuit of claim 3, wherein the first signal triggers an SAR DAC (successive approximation register digital to analog converter), the second signal triggers a comparator, and the external control signal indicates a comparator settled condition.

5. The timing circuit of claim 1, wherein the first and second delay blocks include CMOS inverters.

6. A method for generating asynchronous signals, the method comprising:
   generating a first signal and a second signal using an SR latch, the first and second signals being asynchronous;
   generating a delayed first signal and providing the delayed first signal to a first input terminal of the SR latch; and
   generating a delayed second signal and providing the delayed second signal to a second input terminal of the SR latch,
   wherein the first and second delay blocks delay positive going edges of the first and second signals differently than negative going edges of the first and second signals to avoid a premature change of state of the SR latch.

7. The method of claim 6, further including generating a disable signal for the SR latch.

8. The method of claim 6, wherein the first signal triggers an SAR DAC (successive approximation register digital to analog converter) and the second signal triggers a comparator.

9. The method of claim 6, further including providing an external control signal that in combination with the delayed second signal determine when a state of the SR latch is changed.

10. The method of claim 9, wherein the first signal triggers an SAR DAC (successive approximation register digital to analog converter), the second signal triggers a comparator, and the external control signal indicates a comparator settled condition.

* * * * *